United States Patent
Georgescu et al.

(10) Patent No.: US 9,418,476 B2
(45) Date of Patent: Aug. 16, 2016

(54) MESH QUALITY IMPROVEMENT IN COMPUTER AIDED ENGINEERING

(71) Applicant: FUJITSU LIMITED, Kawasaki-shi, Kanagawa (JP)

(72) Inventors: Serban Georgescu, London (GB); Peter Chow, Kent (GB); Tetsuyuki Kubota, Acton (GB); Muhammad Abdurrahman, London (GB); Makoto Sakairi, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 146 days.

(21) Appl. No.: 14/291,149

(22) Filed: May 30, 2014

(65) Prior Publication Data

US 2015/0221130 A1 Aug. 6, 2015

(30) Foreign Application Priority Data

Feb. 5, 2014 (EP) .................... 14153939

(51) Int. Cl.
*G06T 17/20* (2006.01)
*G06F 17/50* (2006.01)

(52) U.S. Cl.
CPC .............. *G06T 17/205* (2013.01); *G06F 17/50* (2013.01); *G06T 2210/52* (2013.01)

(58) Field of Classification Search
CPC .......... G06T 17/20; G06T 17/10; G06F 17/50
See application file for complete search history.

(56) References Cited

U.S. PATENT DOCUMENTS

2004/0117163 A1 6/2004 Rivara
2007/0011646 A1 1/2007 Chrisochoides et al.

FOREIGN PATENT DOCUMENTS

EP 2 680 231 A1 1/2014

OTHER PUBLICATIONS

Extended European Search Report dated Sep. 2, 2014 in corresponding European Patent Application No. 14153939.5.
Tremel et al., "Parallel remeshing of unstructured volume grids for CFD applications", International Journal for Numerical Methods in Fluids, vol. 53, 2007, pp. 1361-1379.
Coupez et al., "Parallel meshing and remeshing", Applied Mathematical Modelling, vol. 25, 2000, pp. 153-175.
Gustavo C. Buscaglia et al. "Optimization Strategies in Unstructured Mesh Generation", *International Journal for Numerical Methods in Engineering*, 1996, pp. 2055-2071, vol. 39, John Wiley & Sons, Ltd.
Bryan Matthew Klingner, "Improving Tetrahedral Meshes", *Technical Report No. UCB/EECS*-2008-145, Nov. 25, 2008, pp. 1-146, Electrical Engineering and Computer Sciences, University of California at Berkeley, Berkeley, California.
Sandia National Laboratories, "Mesh Quality Improvement Toolkit", last modified May 5, 2009, http://trilinos.sandia.gov/packages/mesquite/.
Stellar, "A Tetrahedral Mesh Improvement Program", last accessed May 14, 2014, http://www.cs.berkeley.edu/~jrs/stellar/.

*Primary Examiner* — Haixia Du
(74) *Attorney, Agent, or Firm* — Staas & Halsey LLP

(57) ABSTRACT

A method, for use in meshing a CAD domain in a computer-aided design (CAD) or computer-aided engineering (CAE) system, comprises carrying out a procedure comprising: obtaining a set of mesh elements by extracting, from a previously-generated mesh of the CAD domain which has undergone a mesh element optimization process in respect of interior elements of the previously-generated mesh, mesh elements which do not satisfy a preselected mesh quality metric; decomposing the set of mesh elements into connected sub-meshes; carrying out a serial mesh element optimization process in respect of each sub-mesh independently and in parallel, under the condition that boundary nodes of sub-meshes are not moved, to obtain optimized sub-meshes; and obtaining an optimized mesh of the CAD domain by integrating the optimized sub-meshes into the previously-generated mesh.

9 Claims, 12 Drawing Sheets

Related Art

Related Art

MESH QUALITY IMPROVEMENT IN COMPUTER AIDED ENGINEERING

CROSS-REFERENCE TO RELATED APPLICATION

This application claims the foreign priority benefit of European Patent Application No. 14153939.5, filed Feb. 5, 2014, the contents of which are incorporated herein by reference.

BACKGROUND OF THE INVENTION (1) Field of the Invention

The present invention relates to mesh quality improvement in Computer Aided Engineering.

Computed Aided Engineering (CAE), the use of computer software for the purpose of modelling and simulating the behaviour of products in order to improve their quality, has become nearly ubiquitous in the manufacturing industry. Areas covered by CAE include, but are not limited to, stress and thermal analysis, fluid dynamics and kinematics.

(2) Description of Related Art

Figure 1:
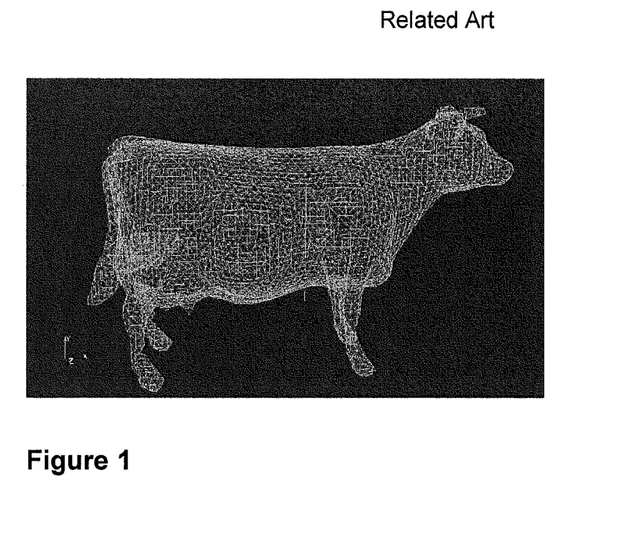
FIG. 1 (described above) shows an example of a 3D computational mesh.

A typical CAE process starts with a Computer Aided Design (CAD) file which represents the geometrical model of the object that is analyzed. The CAD file, created using specialized CAD software, passes first through a pre-processing step where the geometry is partitioned (meshed) into a very large number of elements, which form what is called a mesh. An example of a computational mesh is shown in FIG. 1 of the accompanying drawings. The mesh, accompanied by boundary conditions, is then sent to a solver which uses standard numerical techniques in order to compute the result of the analysis.

Currently available meshers can be divided into two categories: serial and parallel. Serial meshers are restricted to the computational power of only one processor and to the memory attached to it. With a mesh of order 1 Million elements requiring in the order of 1 GB of memory to create, it is clear that memory is a severe limitation for such codes. Parallel meshers are able to create much larger meshes and in a much shorter time by distributing the workload to a number of processors found either in one computer or, more often, in a number of computers connected by a network. In accordance with the amount of communication performed between the processors while meshing, parallel mesh generators can be further divided into three categories: tightly coupled, loosely coupled and decoupled. In the serial or parallel-coupled case, one or more processors work to create a single mesh. The quality of this mesh will in general be better than for the decoupled case. However, as this type of meshing is not scalable, the meshing time will in general be very long, especially for complex models such as the ones found in industrial CAD models. Only decoupled parallel meshers (which require no communication or synchronization between different processing parts) can achieve 100% reuse of the serial meshing code and are truly scalable. Scalability is achieved by partitioning the domain that is to be meshed into a number of disjoint sub-domains, which are then independently meshed, so the meshing time is much shorter. Such a scalable parallel-decoupled mesher was recently proposed in EP12173469.3 (US2014039847A1 published Feb. 6, 2014). However, it is possible to create artificially small elements at the interfaces between domains by cutting the CAD model in a poor position. In this case, the overall quality of the mesh will in general be lower. This is especially likely in the case where the cutting plane intersects small CAD features.

The creation of a high quality mesh is very important as it can both reduce the time spent in the solver and increase the accuracy of the solution. The quality of the mesh can be improved with specialized tools ranging from simple Laplacian smoothing (see Electrical Engineering and Computer Sciences University of California at Berkeley, 2008 "Improving Tetrahedral Meshes" page 21) to complex optimization tools like STELLAR (see "Stellar—A Tetrahedral Mesh Improvement Program", <http://www.cs.berkeley.edu/~jrs/stellar/#about>) that perform complex sequences of operations on mesh nodes and elements. While the use of complex optimization tools usually results in much higher quality meshes as compared with simple ones, it is also much more expensive. Moreover, high quality mesh optimization codes are very time consuming. A high quality mesh optimization tool such as STELLAR can take as much as 10 times longer than mesh generation, which means such codes cannot be used in day-to-day production work. The natural way of overcoming this problem would be to make use of the multicore CPUs available in modern computers and computer clusters. However, this is currently not possible because many such codes (e.g. STELLAR) are serial in nature and parallelizing them is not straightforward.

Zavattieri, P., Dari, E. and Buscaglia, G. 1996: "Optimization strategies in unstructured mesh generation" *International Journal for Numerical Methods in Engineering*, 39 (12), pp. 2055-2071, discloses an optimization method for unstructured 3-D finite element meshes. This document discusses different algorithms for improving overall mesh quality including smoothing algorithms, but it does not address scalability.

Mesh optimization software called "Mesquite Mesh Optimization Toolkit" (Sandia Labs, <http://trilinos.sandia.gov/packages/mesquite/>) performs smoothing operations in parallel, but is not readily scalable.

It is desirable to provide a method of generating high quality computational meshes in a decoupled and thus scalable manner.

BRIEF SUMMARY OF THE INVENTION

According to an embodiment of a first aspect of the present invention there is provided a method for use in meshing a CAD domain in a computer-aided design (CAD) or computer-aided engineering (CAE) system, which method comprises carrying out a procedure comprising: obtaining a set of mesh elements by extracting, from a previously-generated mesh of the CAD domain which has undergone a mesh element optimization process in respect of interior elements of the previously-generated mesh, mesh elements which do not satisfy a preselected mesh quality metric; decomposing the set of mesh elements into connected sub-meshes; carrying out a serial mesh element optimization process in respect of each sub-mesh independently and in parallel, under the condition that boundary nodes of sub-meshes are not moved, to obtain optimized sub-meshes; and obtaining an optimized mesh of the CAD domain by integrating the optimized sub-meshes into the previously-generated mesh.

A method embodying the present invention is capable of creating a high quality mesh in a faster and more scalable way than existing methods, using serial mesh optimization code yet taking advantage of parallel processing in an efficient way.

In particular, an embodiment of the present invention can provide an improvement over decoupled meshing methods which can create low quality elements at the interface between domains. Moreover, it can provide a method of performing decoupled parallel mesh optimization using a mesh optimization code which may not be parallel.

In a method embodying the present invention, obtaining a set of mesh elements may further comprise, after extracting mesh elements which do not satisfy the preselected mesh quality metric, using mesh element connectivity in respect of the extracted mesh elements to identify additional mesh elements for inclusion in the set such that the number of mesh elements in the set is expanded to a required level.

A method embodying the present invention may further comprise, before carrying out the procedure, generating a mesh for use in the procedure by splitting the CAD domain into a plurality of sub-domains, creating a sub-domain mesh in respect of each sub-domain, optimizing interior elements of each sub-domain mesh, and merging the resulting sub-domain meshes together to form the mesh. The sub-meshes may desirably be created using a parallel decoupled meshing process. The interior elements of each sub-domain mesh are preferably optimized using a serial mesh element optimization process. The mesh optimization process may desirably be carried out on the respective sub-meshes independently and in parallel.

According to an embodiment of a second aspect of the present invention there is provided apparatus for use in meshing a CAD domain in a computer-aided design (CAD) or computer-aided engineering (CAE) system, which apparatus comprises: set extraction means configured to obtain a set of mesh elements by extracting, from a previously-generated mesh of the CAD domain which has undergone a mesh element optimization process in respect of interior elements of the previously-generated mesh, mesh elements which do not satisfy a preselected mesh quality metric; sub-mesh creation means configured to decompose the set of mesh elements into connected sub-meshes; sub-mesh optimization means configured to carry out a serial mesh element optimization process in respect of each sub-mesh independently and in parallel, under the condition that boundary nodes of sub-meshes are not moved, to obtain optimized sub-meshes; and mesh integration means configured to obtain an optimized mesh of the CAD domain by integrating the optimized sub-meshes into the previously-generated mesh.

Apparatus embodying the present invention facilitates the creation of a high quality mesh in a faster and more scalable way than existing apparatus, using serial mesh optimization code yet taking advantage of parallel processing in an efficient way. It can provide an improvement over decoupled meshing apparatus which can create low quality elements at the interface between domains. Moreover, it can perform decoupled parallel mesh optimization using a mesh optimization code which may not be parallel.

In apparatus embodying the present invention, the set extraction means may comprise: element extraction means operable to extract mesh elements from the previously-generated mesh which do not satisfy the preselected mesh quality metric; and set expansion means operable to expand the number of mesh elements in the set to a required level by using mesh element connectivity in respect of the extracted mesh elements to identify additional mesh elements for inclusion in the set.

Apparatus embodying the present invention may further comprising meshing means configured to generate a mesh for supply to the set extraction means, the meshing means comprising: cutting means configured to split the CAD domain into a plurality of sub-domains; sub-domain meshing means configured to create a sub-domain mesh in respect of each sub-domain; sub-domain mesh optimization means configured to optimize interior elements of each sub-domain mesh; and mesh merging means configured to merge the resulting sub-domain meshes together to form the mesh. The sub-domain meshing means are preferably operable to create the sub-meshes using a parallel decoupled meshing process. Desirably, the sub-domain optimization means may be operable to optimize the interior elements of each sub-domain mesh using a serial mesh element optimization process. Preferably the sub-domain optimization means are operable to carry out the mesh optimization process on the respective sub-meshes independently and in parallel.

According to an embodiment of a third aspect of the present invention there is provided a computer program which, when run on a computer or network of computers, causes that computer or network to carry out a method embodying the first aspect of the present invention or to become apparatus embodying the second aspect of the present invention.

BRIEF DESCRIPTION OF THE DRAWINGS

Reference will now be made, by way of example, to the accompanying drawings, in which.

DETAILED DESCRIPTION OF THE INVENTION

Figure 2:
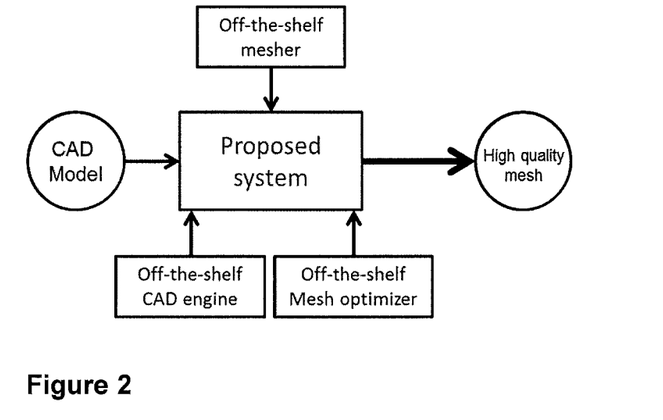
FIG. 2 shows an example of a CAD system in which a meshing apparatus embodying the present invention can be used.

FIG. 2 shows where a meshing method or meshing apparatus embodying the present invention can be utilized in a CAD system comprising an off-the-shelf CAD engine, an off-the-shelf mesher and an off-the shelf mesh optimizer.

Given a CAD model stored in a data format supported by the CAD engine, an embodiment of the present invention employs the following existing components:
- A meshing code that, given a CAD model, is capable of creating an initial (original) 3D computational mesh
- A CAD engine (also called a CAD kernel) that can read and can perform modifications to the CAD file
- A mesh optimizer that, after reading the mesh file and applying optimization methods known in the art, outputs a mesh with better quality than the initial 3D (original) computational mesh.

Although not essential in order to provide an improvement over the prior art, it is desirable to generate the initial mesh using a decoupled parallel meshing system, for example such as that proposed in EP12173469.3. An embodiment of the present invention which employs the decoupled parallel meshing system of EP12173469.3 to generate the initial mesh is described below.

An assembly model is a CAD model consisting of multiple solids, which may or may not be in physical contact with each other. Throughout the present application, the term part will have the meaning of a single solid component of an assembly model. For the sake of consistency, if the input CAD file consists of a single solid, we will refer to it as an assembly with one part. A solid may be split/partitioned into a number of sections. A 2D meshing operation is the discretization of the faces of a solid by 2D elements such as triangles or quadrilaterials. A 3D meshing operation is the discretization of the entire volume of a solid by 3D elements such as tetrahedrals or hexahedrals. A mesh merge operation is the combining of the 3D meshes of the individual sections of a part into one coherent 3D mesh for that part. A coherent mesh is defined as one single connected mesh, without duplicate nodes on the interfaces between sections. A mesh assembly operation is the putting together of the meshes for one or more individual parts into one single mesh for the assembly model. The difference between mesh assembly and mesh merging is that an assembled mesh does not become one single connected mesh. In other words, even if the meshes of two parts are in physical contact, the interface will contain two sets of nodes and elements, one set for each mesh. More formally, there is no element in the assembled mesh which has nodes belonging to the meshes of more than one part.

Figure 3:
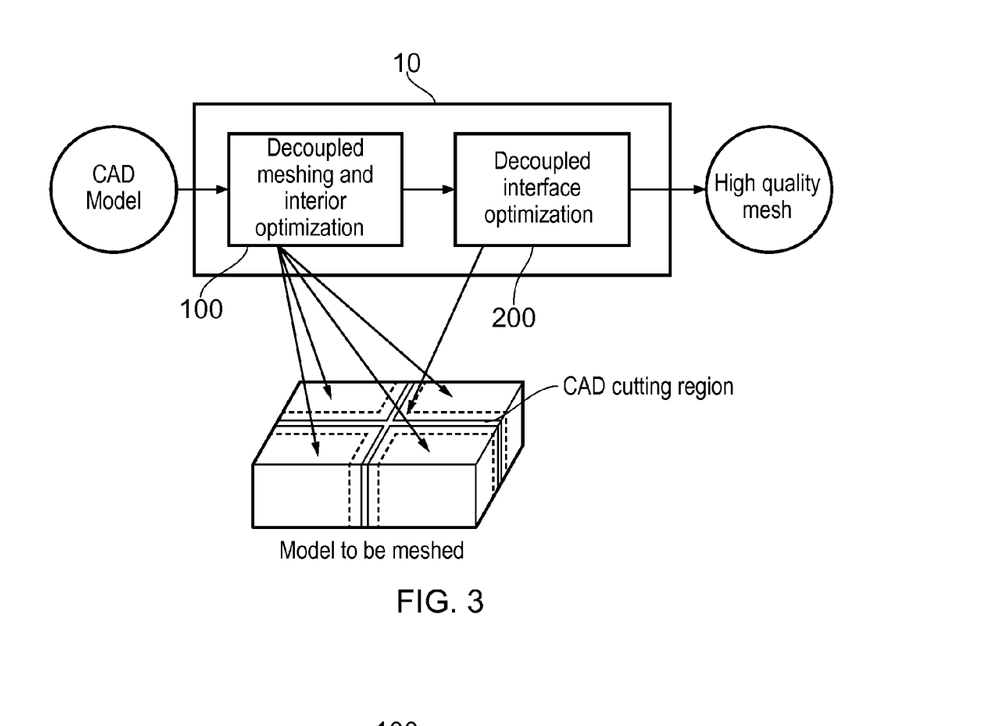
FIG. 3 shows a meshing apparatus embodying the present invention.

As shown in FIG. 3, an embodiment of the proposed system comprises two modules, a decoupled meshing and interior optimization module 100 (meshing means) and a decoupled interface optimization module 200.

Figure 4:
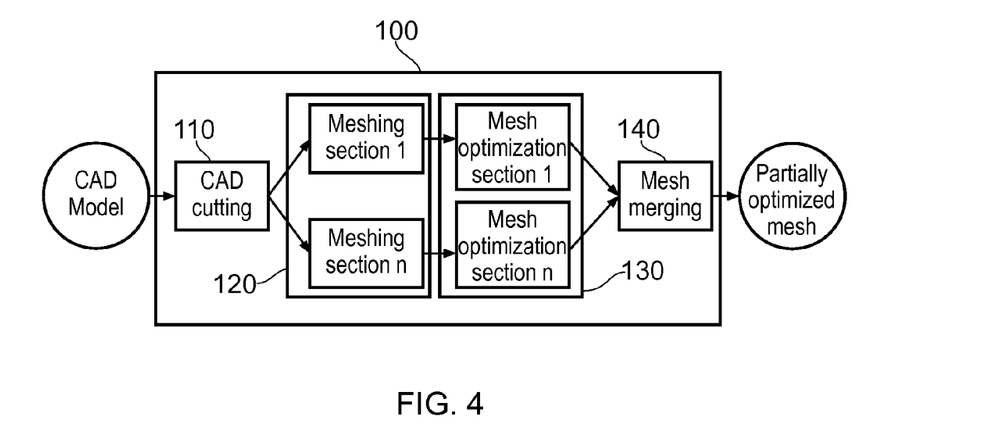
FIG. 4 shows a decoupled meshing and interior optimization module for use in an embodiment of the present invention.

As shown in FIG. 4, the decoupled meshing and interior optimization module 100, which will be discussed in more detail later, comprises a CAD cutting unit 110, a meshing unit 120, a mesh optimization unit 130, and a mesh merge unit 140. The decoupled meshing and interior optimization module 100 is operable to augment a decoupled meshing process, such as that disclosed in EP12173469.3, with a mesh optimization process. The mesh optimization process guarantees that the quality of the elements inside each mesh section will be good. While advanced mesh optimization is in general quite expensive, the fact that it is applied independently and in parallel on each mesh section guarantees the scalability of the process. It should be noted that it is not essential that the mesh optimization process is carried out in parallel on each meshed section, as shown in FIG. 4, although this is advantageous.

The output of the decoupled meshing and interior optimization module 100 is a partially optimized mesh, where the large majority of elements are of good quality. However, as mentioned above, in general there will be low quality elements at the interfaces between mesh sections.

The process carried out by the mesh optimization unit 130 guarantees that regions with poor quality elements are isolated, and hence such elements can be easily and naturally decoupled for parallel optimization.

Figure 5:
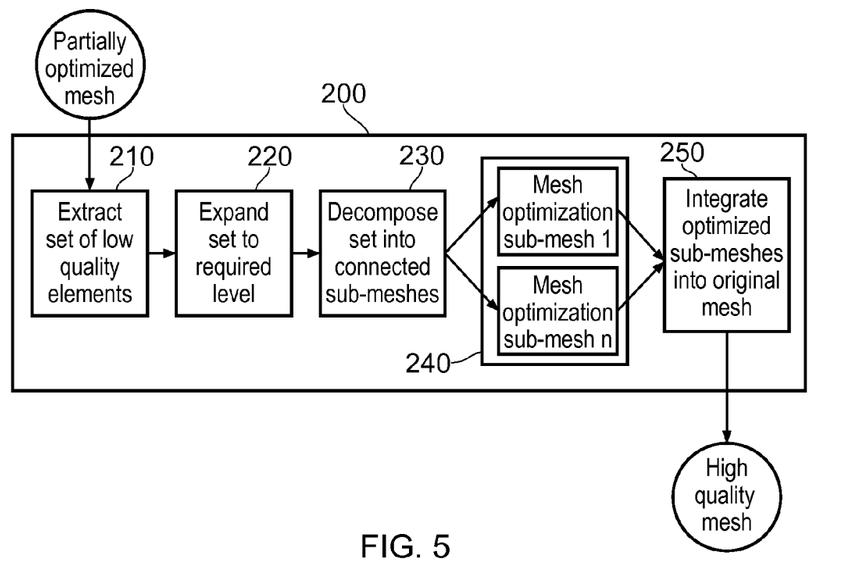
FIG. 5 shows a decoupled interface optimization module for use in an embodiment of the present invention.

As shown in FIG. 5, the decoupled interface optimization module 200, which will be discussed in more detail later, comprises an element extraction unit 210, a set expansion unit 220, a sub-mesh creation unit 230, a sub-mesh optimization unit 240, and a mesh integration unit 250. The decoupled interface optimization module 200 is operable to carry out an optimization process on the partially optimized mesh output from the decoupled meshing and interior optimization module 100 to eliminate the remaining low quality elements, again in an efficient and scalable way. The optimization process starts with the extraction of a set of low quality elements. This set forms a sub-mesh of the initial (original) mesh. The initial mesh is created in such a way that low quality elements can only appear in the regions where mesh sections were glued together, so the number of elements in this set is much smaller than the number of elements in the initial mesh. Following this, element connectivity information is used to expand this set a given number of times, with the purpose of increasing the amount of data available to the mesh optimization software. The expanded set is then decomposed into a number of independent connected components (called sub-meshes of the original mesh) which are optimized, in a parallel decoupled way, using the mesh optimization software. Finally, the optimized sub-meshes are integrated into the initial mesh, which results in a high-quality mesh without any low quality elements.

As depicted in FIG. 5, the input for the decoupled interface optimization module 200 is a partially optimized mesh. This mesh may be generated by the decoupled meshing and interior optimization module 100 using a decoupled parallel meshing system such as shown in FIG. 4, which will now be described in more detail.

Figure 6:
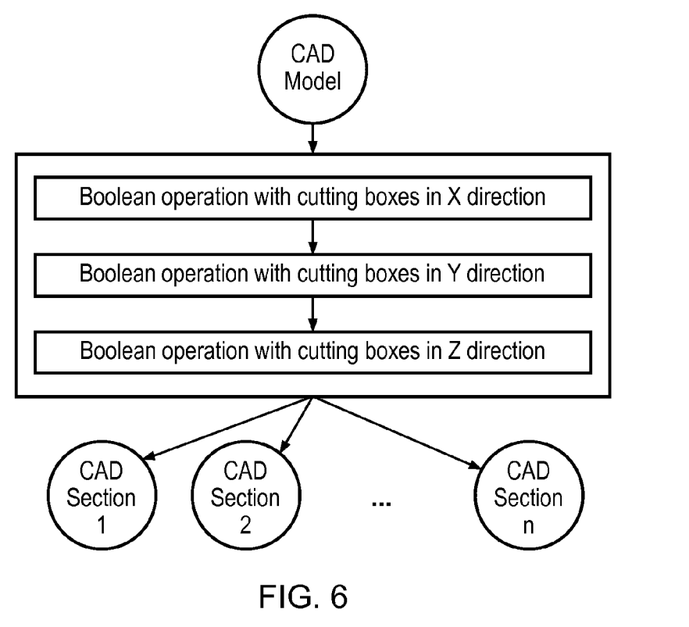
FIG. 6 illustrates a CAD cutting module for use in the present invention.

The CAD cutting unit 110 of FIG. 4 uses an off-the-shelf CAD Kernel to partition one CAD solid into multiple CAD solids. One way of performing the cutting is in a grid-aligned way, where the CAD model is sliced via planes parallel to the coordinate axes. The slicing can be performed using Boolean operations present in the CAD Kernel (e.g. CUT operation in the case of the OpenCASCADE CAD Kernel). However, there are several different ways in which slicing can be done. One example is illustrated in FIG. 6.

Figure 7:
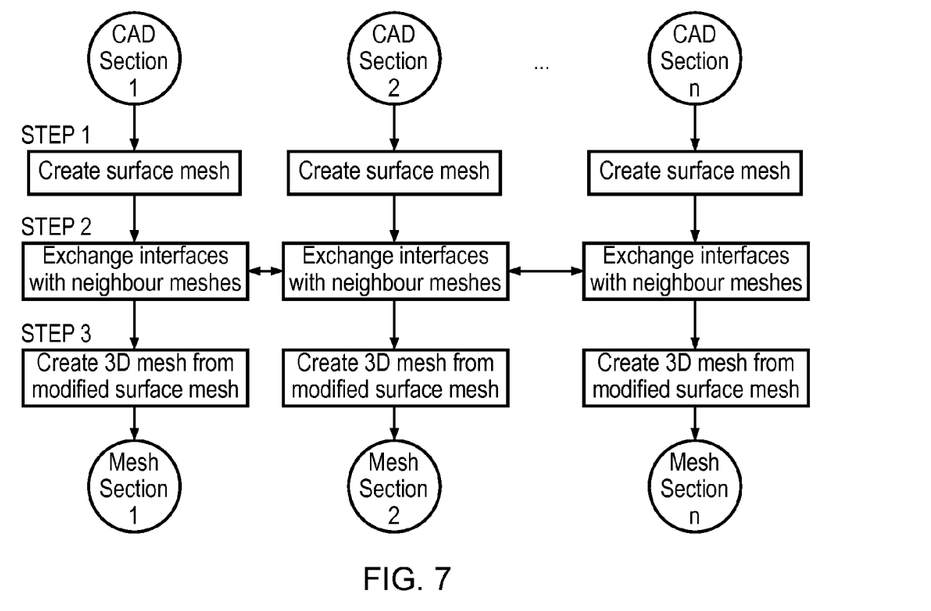
FIG. 7 is a flowchart illustrating a CAD meshing process for use in the present invention.

The meshing unit 120 (sub-domain meshing means) uses an off-the shelf mesher to generate a 3D mesh from each CAD section. The meshing process may use the technology described in EP12173469.3, as illustrated in the flowchart of FIG. 7. In this case, for each CAD section in parallel, an off-the-shelf serial mesher is used to create a surface mesh (STEP 1). Following this, the zones of the meshes found at interfaces between neighbouring sections are identified and mesh information is exchanged (STEP 2). One way of exchanging information is simply to copy the mesh data from one section (set as source) to the other section (set as destination). After the surface meshes have been modified, the interior of the modified surface meshes is meshed in 3D, thus creating a 3D volume mesh for each CAD section (STEP 3).

Figure 8:
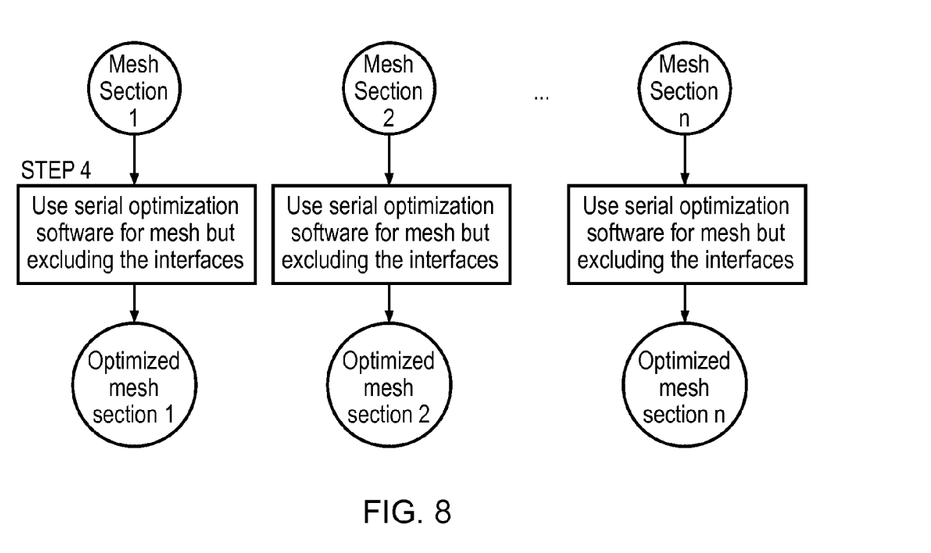
FIG. 8 is a flowchart illustrating a parallel decoupled mesh optimization process for use in the present invention.

As shown in the flowchart of FIG. 8, the mesh optimization unit 130 (sub-domain mesh optimization means) carries out a mesh optimization process for each mesh section using off-the-shelf serial optimization software, such as STELLAR, in such a way that the mesh on the interfaces between sections is not altered (STEP 4).

Figure 9:
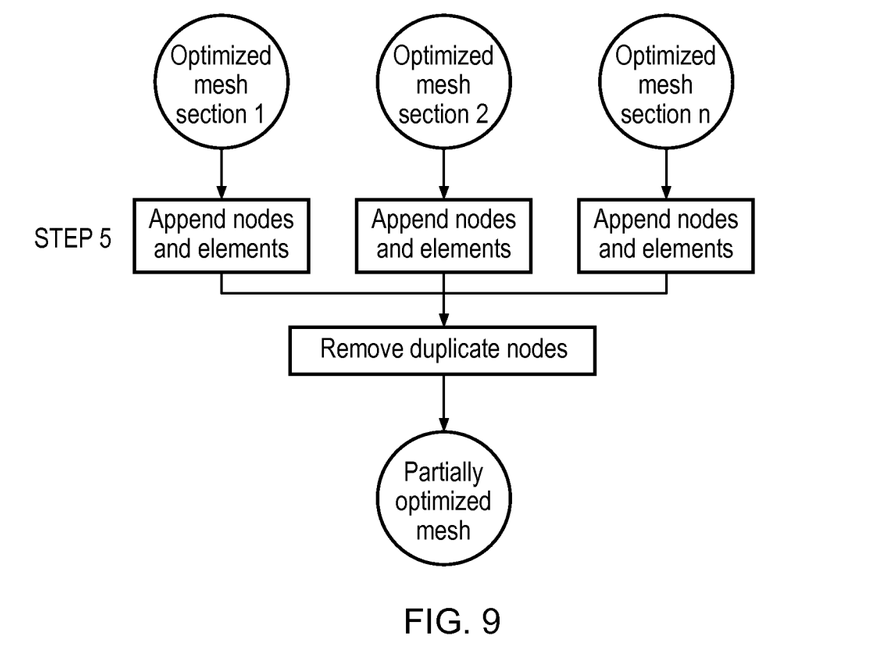
FIG. 9 is a flowchart illustrating a mesh merging process for use in the present invention.

As shown in the flowchart of FIG. 9. the mesh merging unit 140 carries out a mesh merging process to combine the mesh sections into one mesh for the entire CAD solid. This can be done efficiently because the mesh sections have been modified so that the meshes on the interfaces are identical. As such, the operation is reduced to removing duplicate nodes and renumbering the resulting mesh (STEP 5).

Although all mesh sections have been fully optimized, the combined mesh is only partially optimized since it is possible that low quality elements have been created at the interfaces between neighbouring sections. This partially optimized mesh is processed by the decoupled interface optimization module 200, as will now be described.

Figure 10:
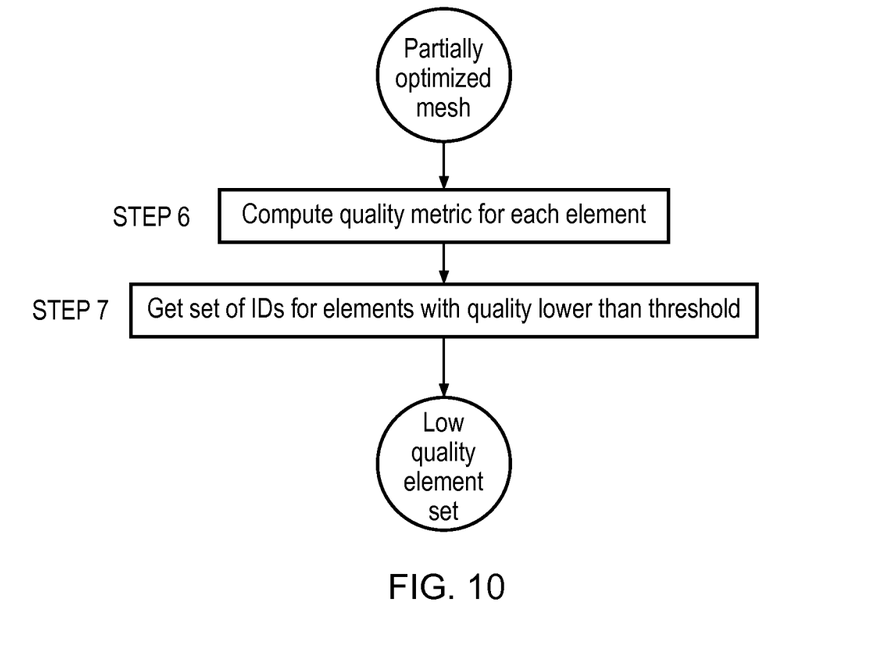
FIG. 10 is a flowchart illustrating a low quality element extraction process for use in the present invention.

As illustrated in the flowchart of FIG. 10, starting with the partially optimized mesh of FIG. 9 as input, a quality metric is computed by element extraction unit 210 for each element in the mesh (STEP 6). One example of a mesh quality metric for a tetrahedral element is the sine of the smallest dihedral angle of the tetrahedron (the minimum sine measure). It should be noted that there are many other methods for measuring the quality of elements, such as biased minimum sine measure, volume-length measure, radius ratio, etc. . . . . After the metric has been computed for each element, only the elements whose quality falls below a set threshold are selected for extraction (STEP 7). One example of a threshold when using the minimum sine quality metric is 10 degrees. The IDs of the selected elements form a set of low quality elements which have been isolated from the partially optimized mesh using the element quality measure.

Figure 11:
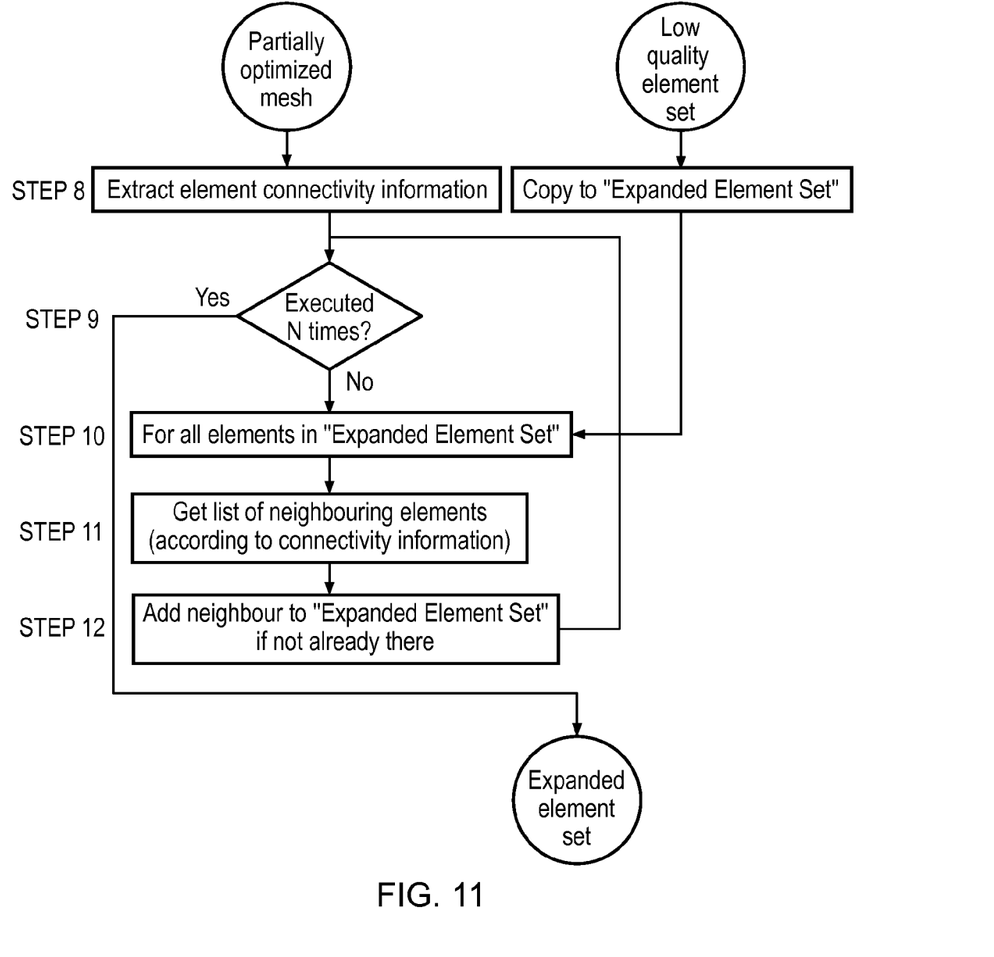
FIG. 11 is a flowchart illustrating a process for obtaining an expanded element set.
Figure 12:
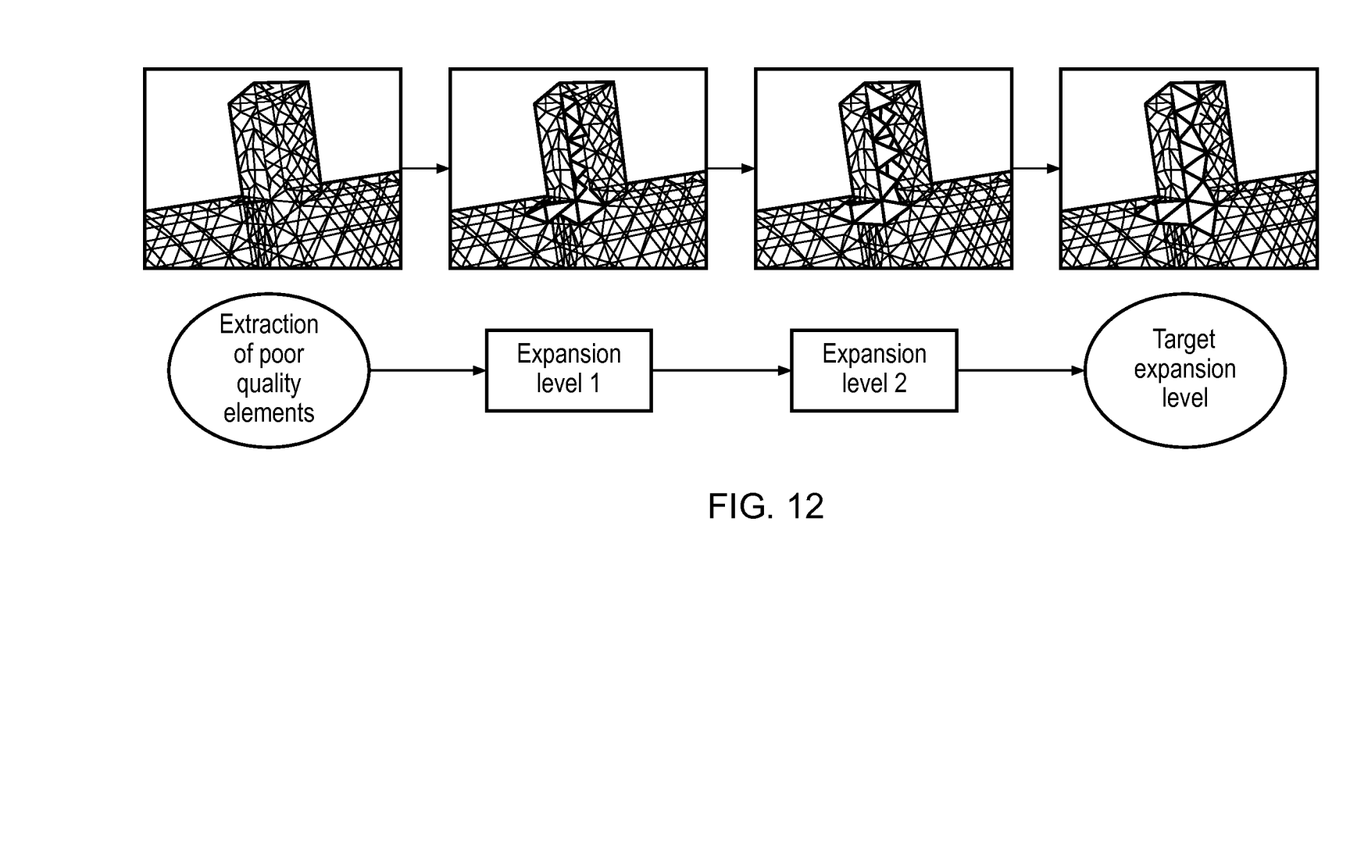
FIG. 12 illustrates an example of element set expansion for facilitating optimization of low quality elements.
Figure 13:
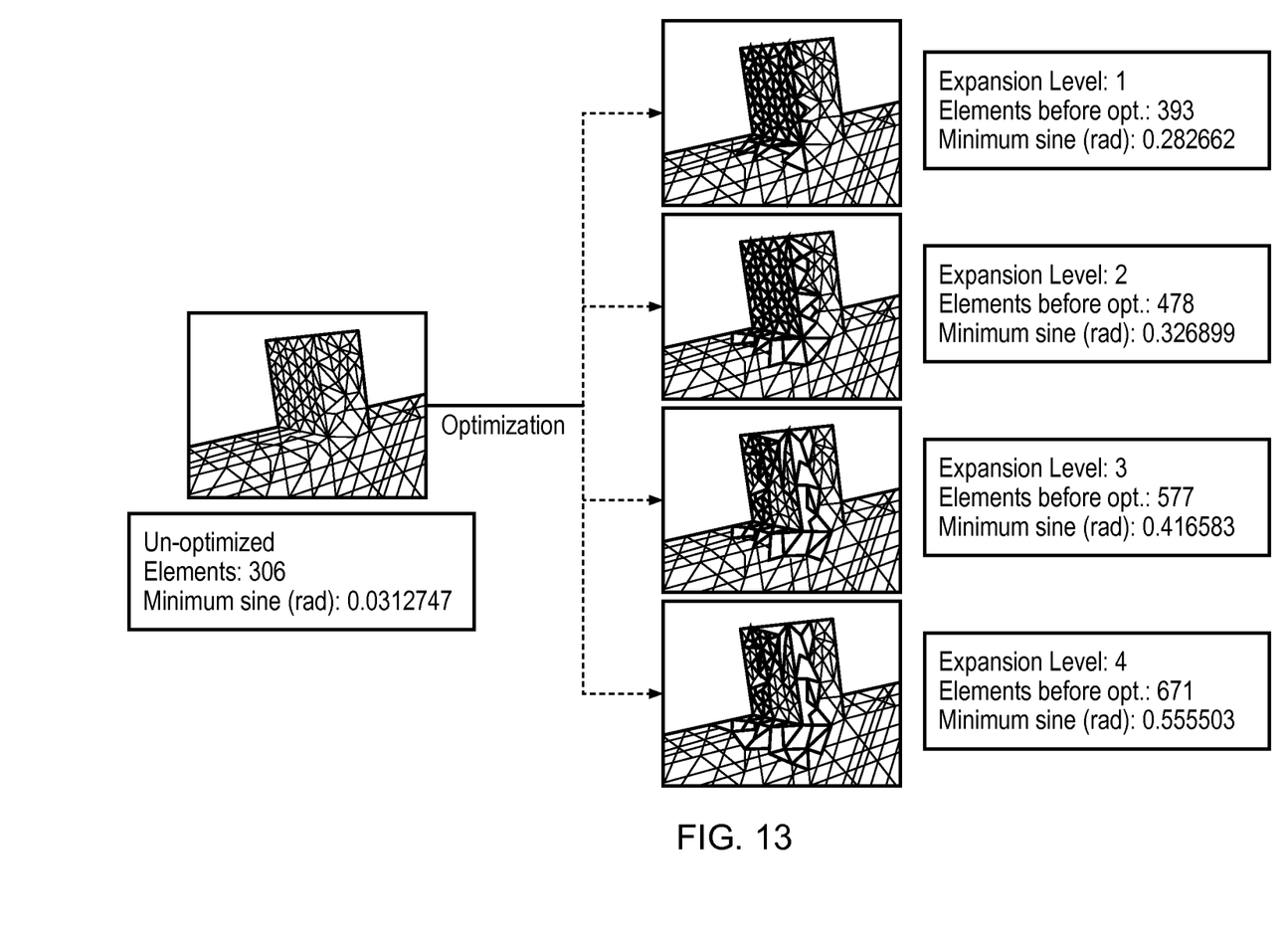
FIG. 13 illustrates variation in mesh quality post optimization between different expansion levels.

In order to be able to efficiently insert the optimized region back into the solid mesh it is necessary to leave the boundaries untouched. However, optimizing a relatively small number of elements (as is the case for the set of low quality elements) with such a constraint can lead to a sub-optimal result, as the mesh optimization software does not have enough freedom to operate. For this reason, the sub-mesh that is to be sent to the sub-mesh optimization unit 240 is expanded by the set expansion unit 220 to include neighbouring elements, and the condition for not modifying the boundaries is applied to this larger set. The flowchart of FIG. 11 illustrates the operation of the set expansion unit 220 and an example of the set expansion process is shown in FIG. 12. Firstly, element connectivity information is extracted from the partially optimized mesh (STEP 8). Then a check is made to determine whether the set expansion process has been carried out N times (STEP 9). If "Yes", then the expanded element set is complete. Otherwise, for all elements presently in the expanded element set (STEP 10), a list of neighbouring elements, according to the connectivity information, is obtained (STEP 11) and any neighbouring elements not already in the expanded element set are added to that set (STEP 12). This process is repeated N times (typically N=2 or 3) in order to improve the quality of the optimization, as illustrated in FIG. 13.

Figure 14:
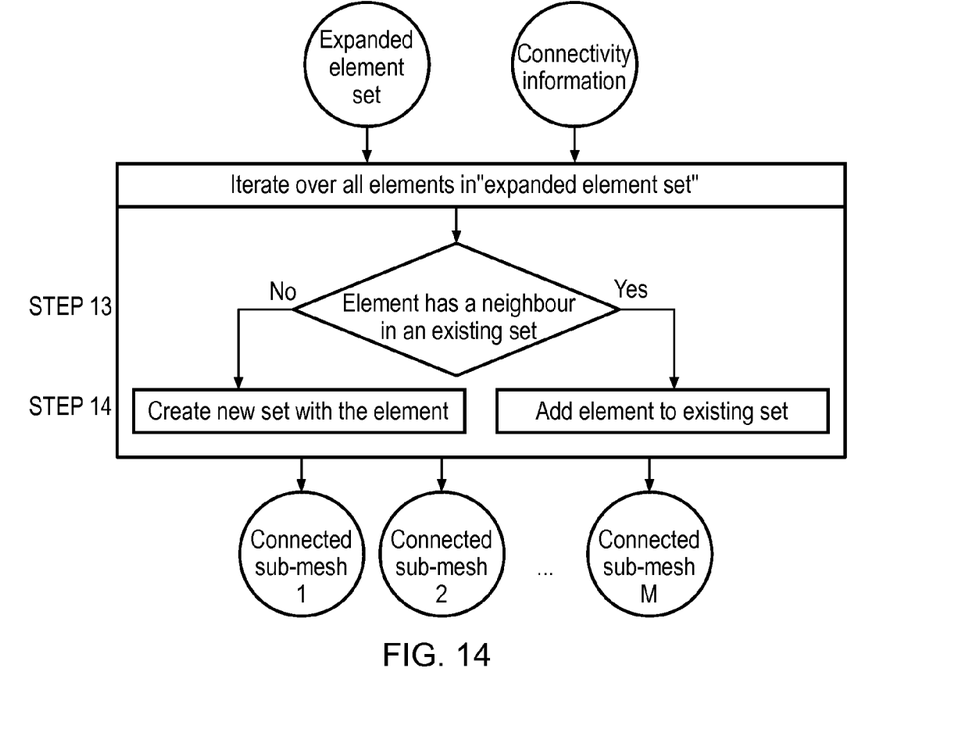
FIG. 14 is a flowchart illustrating a process for decomposing the expanded element set into connected sub-meshes.

The next stage is the decomposition of the set of elements into connected sub-meshes by the sub-mesh creation unit 230. As low quality elements can now only exist at the interfaces between neighbouring sections, there is a high probability that these will be grouped into several independent sub-regions. As illustrated in the flowchart of FIG. 14, these independent connected regions are found using the element connectivity information and identified as respective sets of connected elements (STEP 13). After these sets are identified, sub-meshes are created from each set (STEP 14). If the sub-mesh size exceeds a defined threshold then it may be partitioned into further sub-meshes using a mesh partitioning algorithm.

Figure 15:
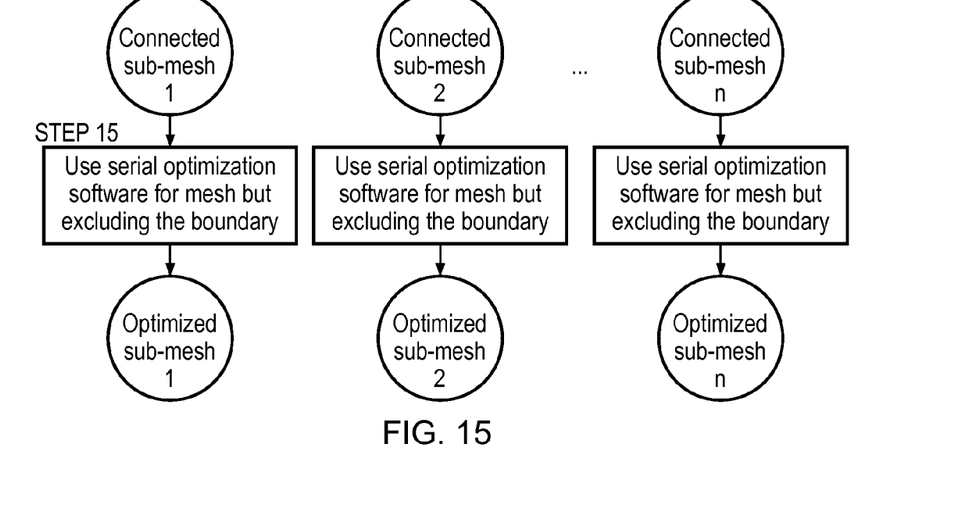
FIG. 15 is a flowchart illustrating a process for performing decoupled parallel optimization of the sub-meshes.

As illustrated in the flowchart of FIG. 15, similarly to the operation of the mesh optimization unit 130, each connected sub-mesh is then independently optimized by the sub-mesh optimization unit 240, preferably using the same off-the-shelf serial optimization software as used in STEP 4 (STEP 15). Overall this becomes a decoupled parallel optimization, even though a serial mesh optimization software is used. The only restriction placed on the optimization software is that the mesh on the boundary of each sub-mesh should not be modified, so that it is possible to merge the resulting plurality of optimized sub-meshes into the initial (original) mesh.

Figure 16:
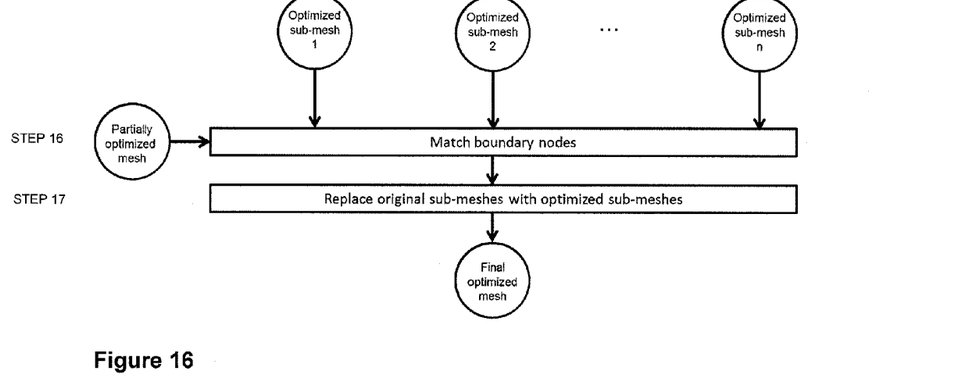
FIG. 16 is a flowchart illustrating a process for integrating optimized sub-meshes in the initial mesh.

The final stage of the process, illustrated in FIG. 16, is for the mesh integration unit 250 to integrate the independently optimized sub-meshes back into the initial mesh (STEPS 16 and 17). Matching of boundary nodes can be done efficiently, as the boundary regions have not been modified.

An advantage of an embodiment of the present invention over the prior art will now be explained with reference to a comparative example. Both the embodiment described and the comparative example employ the decoupled parallel meshing system disclosed in EP12173469.3.

In the comparative example, a CAD model is partitioned into sections and these sections are then meshed in parallel. The output meshes are then all merged back into a single mesh, which is subsequently optimized to remove all bad elements. Mesh optimization is done using STELLAR software, which is one of the best mesh optimization programs currently available. However, like most high performance optimization software, STELLAR can only be executed in serial.

Figure 17:
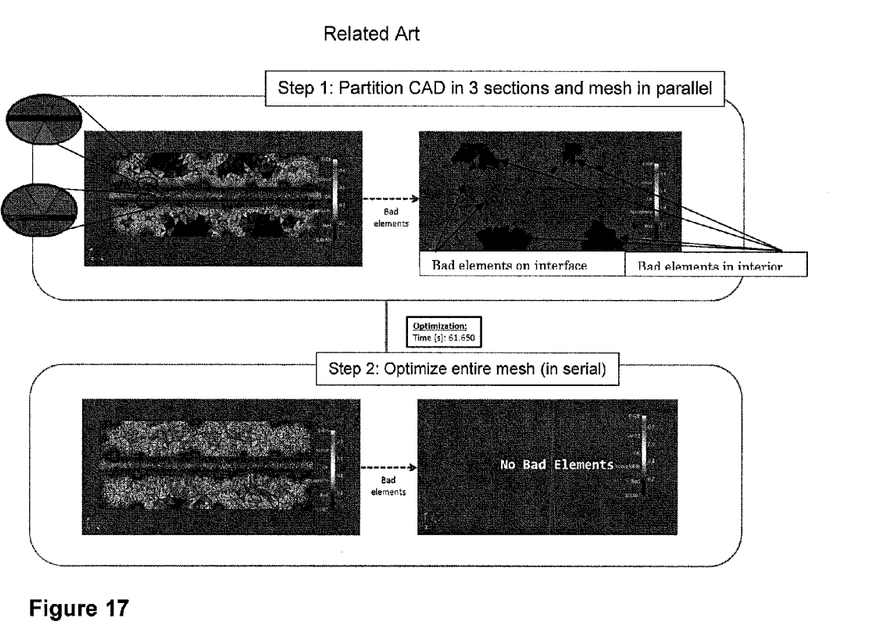
FIG. 17 illustrates mesh optimization using a previously-proposed decoupled parallel meshing system.

FIG. 17 illustrates a case study of this procedure where a CAD model was partitioned into three sections. The total meshing time for the model was 29.819 s. For illustration, the assumption is made that the CAD model is partitioned in a manner such that the volumes in the partitions are equal. With this assumption the meshing time for the model can be considered to be 9.940 s (1/3*meshing time of complete model). The total optimization time was 61.650 s and hence the total time for meshing and optimization is 71.590 s (9.940 s+61.650 s).

Figure 18A:
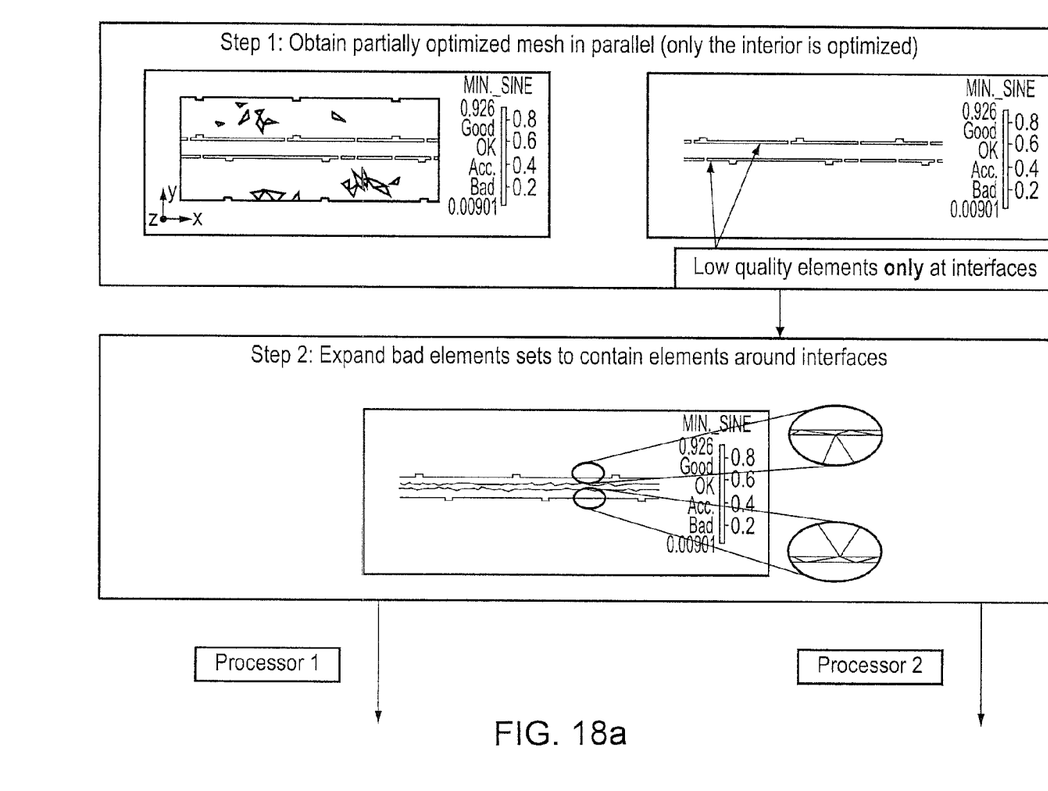
FIGS. 18a and 18b illustrate mesh optimization using a meshing system embodying the present invention.
Figure 18B:
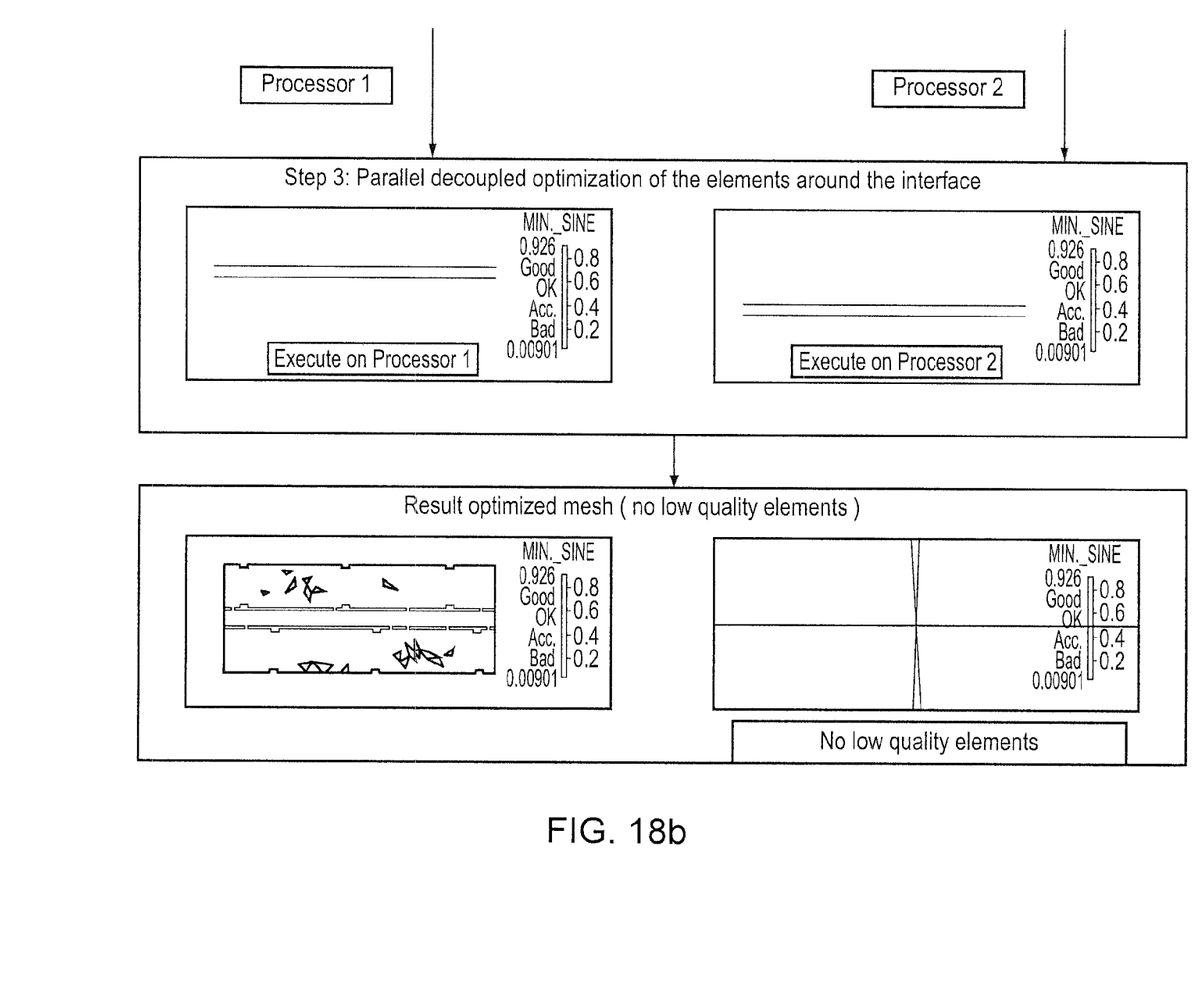

In contrast, in an embodiment of the present invention, the decoupled meshing process disclosed in EP12173469.3 is combined with an optimization step before the initial mesh merging stage and a further optimization stage is then carried out if low quality elements have been introduced at the "cut interfaces". FIG. 18 illustrates the further optimization stage which isolates, optimizes and merges such low quality elements back into the initial (original) mesh. This embodiment also makes use of STELLAR for mesh optimization. However, using a method embodying the present invention, mesh optimization can be executed in parallel, in a decoupled manner, which leads to increased performance.

In this embodiment of the present invention the meshing and optimization times were as follows:
Mesh generation: 9.940 s
Decoupled mesh optimization: 20.550 s (1/3*61.650 s)
Mesh optimization of low quality elements at interface:
  6.958 s (maximum time for optimization across all sections optimized in parallel)

The mesh generation time remains the same at 9.940 s. For the decoupled mesh optimization, since this is performed before the mesh merging it can be assumed to take a third of the time as it did to optimize the complete mesh (as the mesh is split into three parts and optimized in parallel). Further, the optimization time for the low quality elements at the interface will be the maximum across all the low quality element regions being optimized in parallel. As depicted in FIG. 18, the low quality element set that was optimized in processor 2 had a greater optimization time of 6.958 s as compared to that of processor 1 which was 6.282 s. Therefore, we will consider the total time for optimization of the low quality elements at the cut interfaces to be 6.958 s.

The total time for meshing and optimization using an embodiment of the present invention was: 37.448 s. Comparing this to the processing time of 71.590 s in the comparative example, it can be seen that the proposed system has a 47.691% reduction in the total time for mesh optimization.

Thus, an embodiment of the present invention can generate high quality meshes more rapidly, in a decoupled, parallel way, even if the optimization software employed is not parallel.

Embodiments of the present invention may be implemented in hardware, or as software modules running on one or more processors, or on a combination thereof. That is, those skilled in the art will appreciate that a microprocessor or digital signal processor (DSP) may be used in practice to implement some or all of the functionality described above.

The invention may also be embodied as one or more device or apparatus programs (e.g. computer programs and computer program products) for carrying out part or all of the methods described herein. Such programs embodying the present invention may be stored on computer-readable media, or could, for example, be in the form of one or more signals. Such signals may be data signals downloadable from an Internet website, or provided on a carrier signal, or in any other form.

The invention claimed is:

1. A method for use in meshing a computer-aided design (CAD) domain in a computer-aided design (CAD) or a computer-aided engineering (CAE) system, the method comprising:
   generating a mesh by splitting the CAD domain into a plurality of sub-domains, creating a sub-domain mesh corresponding to a respective sub-domain among the plurality of sub-domains, optimizing interior elements of respective sub-domain meshes of the plurality of sub-domains, and merging resulting respective sub-domain meshes together to form the mesh;
   obtaining a set of mesh elements by extracting, from the generated mesh of the CAD domain, mesh elements which do not satisfy a preselected mesh quality metric, and using mesh element connectivity with respect to the extracted mesh elements to identify additional mesh elements for inclusion in the set such that a number of mesh elements in the set is expanded to a required level;
   decomposing the set of mesh elements into connected sub-meshes;
   executing a serial mesh element optimization process on respective sub-meshes independently and in parallel, under a condition that boundary nodes of the sub-meshes are not moved, to obtain optimized sub-meshes; and
   obtaining an optimized mesh of the CAD domain by integrating the optimized sub-meshes into the generated mesh of the CAD domain.

2. The method as claimed in claim 1, wherein the respective sub-meshes are created using a parallel decoupled meshing process.

3. The method as claimed in claim 1, wherein the interior elements of the respective sub-domain meshes are optimized the serial mesh element optimization process.

4. The method as claimed in claim 3, wherein the serial mesh optimization process of claim 3 is executed on the respective sub-meshes independently and in parallel.

5. An apparatus for use in meshing a computer-aided design (CAD) or computer-aided engineering (CAE) system, the apparatus comprising:
   a meshing generator configured to generate a mesh, the meshing generator including:
      a cutter configured to split the CAD domain into a plurality of sub-domains,
      a sub-domain meshing creator configured to create a sub-domain mesh corresponding to a respective sub-domain among the plurality of sub-domains,
      a sub-domain mesh optimizer configured to optimize interior elements of respective sub-domain meshes of the plurality of sub-domains; and
      a mesh merger configured to merge resulting respective sub-domain meshes together to form the mesh;
   a set extractor configured to receive the generated mesh from the meshing generator and to obtain a set of mesh elements by extracting, from the generated mesh of the CAD domain, mesh elements which do not satisfy a preselected mesh quality metric, the set extractor including
      an element extractor operable to extract mesh elements from the generated mesh of the CAD domain which do not satisfy a preselected mesh quality metric, and
      a set expander operable to expand a number of mesh elements in the set to a required level by using mesh element connectivity with respect to the extracted mesh elements to identify additional mesh elements for inclusion in the set;
   a sub-mesh creator configured to decompose the set of mesh elements into connected sub-meshes;
   a sub-mesh optimizer configured to execute a serial mesh element optimization process on respective sub-meshes independently and in parallel, under a condition that boundary nodes of the respective sub-meshes are not moved, to obtain optimized sub-meshes; and
   a mesh integrator configured to obtain an optimized mesh of the CAD domain by integrating the optimized sub-meshes into the generated mesh of the CAD domain.

6. The apparatus as claimed in claim 5 wherein the sub-domain meshing creator is operable to create the respective sub-meshes using a parallel decoupled meshing process.

7. The apparatus as claimed in claim 5, wherein the sub-domain optimizer is operable to optimize the interior elements of the respective sub-domain meshes using the serial mesh element optimization process.

8. The apparatus as claimed in claim 7, wherein the sub-domain optimizer is operable to execute the mesh optimization process on the respective sub-meshes independently and in parallel.

9. A non-transitory computer-readable medium storing a computer program which, when run on a computer or network of computers, causes that computer or network to perform the method of claim 1.

* * * * *